United States Patent
Liu et al.

(10) Patent No.: US 9,660,083 B2
(45) Date of Patent: May 23, 2017

(54) LDMOS FINFET DEVICE AND METHOD OF MANUFACTURE USING A TRENCH CONFINED EPITAXIAL GROWTH PROCESS

(71) Applicants: STMicroelectronics, Inc., Coppell, TX (US); International Business Machines Corporation, Armonk, NY (US); GlobalFoundries Inc, Grand Cayman (KY)

(72) Inventors: Qing Liu, Watervliet, NY (US); Ruilong Xie, Schenectady, NY (US); Chun-Chen Yeh, Clifton Park, NY (US); Xiuyu Cai, Niskayuna, NY (US)

(73) Assignees: STMICROELECTRONICS, INC., Coppell, TX (US); GLOBALFOUNDRIES INC, Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 201 days.

(21) Appl. No.: 14/560,255

(22) Filed: Dec. 4, 2014

(65) Prior Publication Data
US 2016/0163850 A1   Jun. 9, 2016

(51) Int. Cl.
*H01L 29/78* (2006.01)
*H01L 29/08* (2006.01)
(Continued)

(52) U.S. Cl.
CPC .... *H01L 29/785* (2013.01); *H01L 21/823418* (2013.01); *H01L 21/823431* (2013.01);
(Continued)

(58) Field of Classification Search
CPC .......... H01L 29/785; H01L 21/823418; H01L 21/823431
See application file for complete search history.

(56) References Cited

U.S. PATENT DOCUMENTS 7,385,237 B2 *   6/2008   Lee ................... H01L 29/66795
                                                             257/213
8,765,546 B1 *   7/2014   Hung .............. H01L 21/823431
                                                             257/190
(Continued)

*Primary Examiner* — Errol Fernandes
(74) *Attorney, Agent, or Firm* — Gardere Wynne Sewell LLP

(57) ABSTRACT

A FinFET transistor includes a fin of semiconductor material with a transistor gate electrode extending over a channel region. Raised source and drain regions of first epitaxial growth material extending from the fin on either side of the transistor gate electrode. Source and drain contact openings extend through a pre-metallization dielectric material to reach the raised source and drain regions. Source and drain contact regions of second epitaxial growth material extend from the first epitaxial growth material at the bottom of the source and drain contact openings. A metal material fills the source and drain contact openings to form source and drain contacts, respectively, with the source and drain contact regions. The drain contact region may be offset from the transistor gate electrode by an offset distance sufficient to provide a laterally diffused metal oxide semiconductor (LDMOS) configuration within the raised source region of first epitaxial growth material.

30 Claims, 16 Drawing Sheets

(51) Int. Cl.
  *H01L 29/417* (2006.01)
  *H01L 29/66* (2006.01)
  *H01L 21/8234* (2006.01)
  *H01L 21/84* (2006.01)
  *H01L 27/088* (2006.01)
  *H01L 27/12* (2006.01)

(52) U.S. Cl.
  CPC ........ *H01L 21/845* (2013.01); *H01L 27/0886* (2013.01); *H01L 27/1211* (2013.01); *H01L 29/086* (2013.01); *H01L 29/0869* (2013.01); *H01L 29/0878* (2013.01); *H01L 29/0886* (2013.01); *H01L 29/41758* (2013.01); *H01L 29/41791* (2013.01); *H01L 29/66545* (2013.01); *H01L 29/66681* (2013.01); *H01L 29/66795* (2013.01); *H01L 29/7816* (2013.01); *H01L 29/7848* (2013.01)

(56) References Cited

U.S. PATENT DOCUMENTS

| | | |
|---|---|---|
| 8,796,759 B2 | 8/2014 | Perng et al. |
| 2006/0289948 A1 | 12/2006 | Brown et al. |
| 2013/0062692 A1 | 3/2013 | Chen et al. |
| 2013/0299922 A1 | 11/2013 | Choi et al. |
| 2014/0117453 A1 | 5/2014 | Lu |
| 2014/0220752 A1 | 8/2014 | Park et al. |
| 2015/0171193 A1* | 6/2015 | Cheng ............ H01L 21/823431 438/197 |
| 2015/0255567 A1* | 9/2015 | Basu .................... H01L 29/785 257/192 |
| 2015/0255568 A1* | 9/2015 | Basu .................... H01L 29/785 257/192 |

* cited by examiner

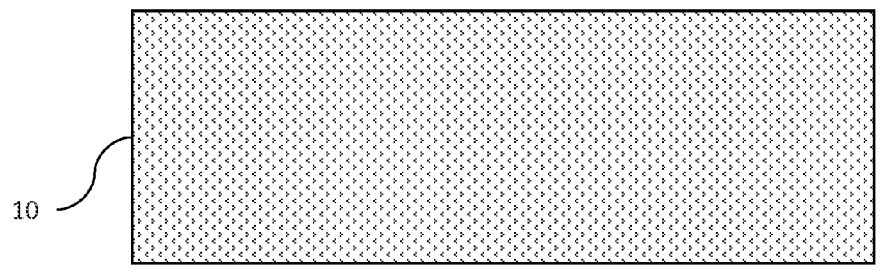
FIG. 1
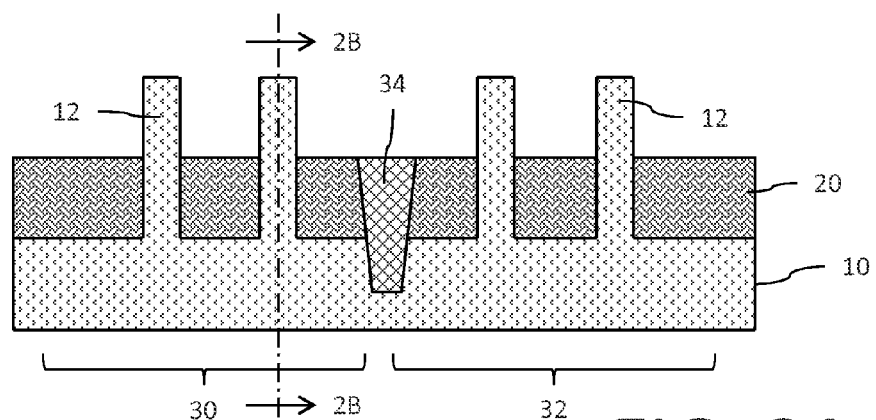
FIG. 2A
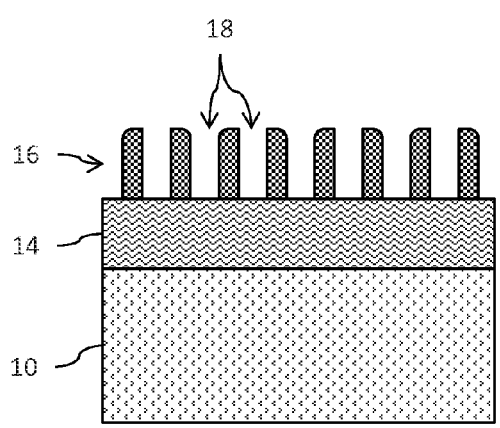 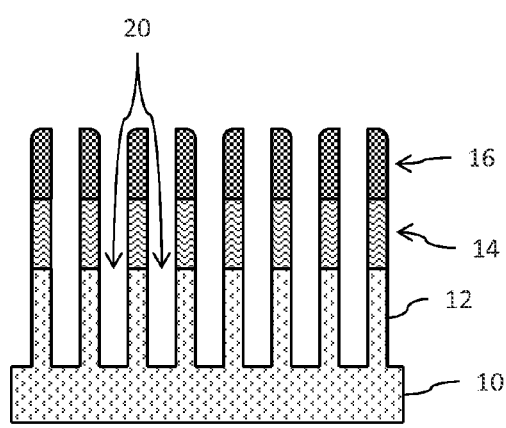
FIG. 3A  FIG. 3B

LDMOS FINFET DEVICE AND METHOD OF MANUFACTURE USING A TRENCH CONFINED EPITAXIAL GROWTH PROCESS

TECHNICAL FIELD

The present invention relates to the fabrication of integrated circuits and, more particularly, to a process for the formation of FinFET-type integrated circuit devices and a device produced by such a process.

BACKGROUND

A FinFET transistor utilizes channel region which is oriented to conduct an electrical current parallel to the surface of the substrate. The channel region is provided in an elongated section of semiconductor material referred to in the art as a "fin." The source and drain regions of the transistor are typically also formed in the elongated section on either side of the channel region. A gate is placed over and on both opposed sides of the elongated section at the location of the channel region to provide control over the conductive state of the transistor. This FinFET design is well suited for manufacturing a multi-channel transistor in which multiple elongated sections are formed in parallel to define neighboring channel regions separated from each other by an intermediate gate portion, where the transistor gate spans with a perpendicular orientation over the multiple elongated sections.

The prior art recognizes the advantages which accrue from the use of FinFET-type transistors. The prior art further recognizes the advantages which accrue from the use of transistors of the laterally diffused metal oxide semiconductor (LDMOS) type which have a highly resistive drain region to support high power and radio frequency (RF) applications. However, it has proven to be quite a challenge to provide an LDMOS which is compatible with FinFET devices. There is a need in the art for the integration of an LDMOS into a FinFET transistor.

SUMMARY

In an embodiment, an integrated FinFET transistor comprises: a fin of semiconductor material; a transistor gate electrode extending over a channel region of said fin; a raised source region of first epitaxial growth material extending from a top of said fin on a first side of the transistor gate electrode; a raised drain region of said first epitaxial growth material extending from a top of said fin on a second side of the transistor gate electrode; a pre-metallization dielectric material covering the raised source region, transistor gate electrode and raised drain region; a source contact opening extending through the pre-metallization dielectric material to said raised source region; a drain contact opening extending through the pre-metallization dielectric material to said raised drain region; a source contact region of second epitaxial growth material at a bottom of the source contact opening; a drain contact region of said second epitaxial growth material at a bottom of the drain contact opening; and metal material filling said source and drain contact openings to form source and drain contacts, respectively, with the source and drain contact regions.

The drain contact region of said second epitaxial growth material may, in an embodiment, be offset from the second side of the transistor gate electrode by an offset distance to provide with said raised source region of first epitaxial growth material a laterally diffused metal oxide semiconductor (LDMOS) configuration.

In an embodiment, a process for manufacturing a FinFET transistor, comprises: forming a fin of semiconductor material; forming a transistor gate structure extending over a channel region of said fin; epitaxially growing first epitaxial growth material on a top of said fin on a first side and second side of the transistor gate electrode to form a raised source region and a raised drain region, respectively; depositing a pre-metallization dielectric material to cover the raised source region, transistor gate electrode and raised drain region; extending a source contact opening through the pre-metallization dielectric material to said raised source region; extending a drain contact opening through the pre-metallization dielectric material to said raised drain region; epitaxially growing second epitaxial growth material at a bottom of the source and drain contact openings to form a source contact region and a drain contact region, respectively; and filling the source and drain contact openings with metal to form source and drain contacts, respectively, with the source and drain contact regions.

The method may further comprise, in an embodiment, offsetting the drain contact region of said second epitaxial growth material from the second side of the transistor gate electrode by an offset distance to provide with said raised source region of first epitaxial growth material a laterally diffused metal oxide semiconductor (LDMOS) configuration.

In an embodiment, an integrated circuit comprises: a substrate; a first FinFET transistor supported by said substrate; and a second FinFET transistor support by said substrate. Each FinFET transistor comprises: a fin of semiconductor material; a transistor gate electrode extending over a channel region of said fin; a raised source region of first epitaxial growth material extending from a top of said fin on a first side of the transistor gate electrode; a raised drain region of said first epitaxial growth material extending from a top of said fin on a second side of the transistor gate electrode; a pre-metallization dielectric material covering the raised source region, transistor gate electrode and raised drain region; a source contact opening extending through the pre-metallization dielectric material to said raised source region; a drain contact opening extending through the pre-metallization dielectric material to said raised drain region; a source contact region of second epitaxial growth material at a bottom of the source contact opening extending from said raised source region; a drain contact region of said second epitaxial growth material at a bottom of the drain contact opening extending from said raised drain region; and metal material filling said source and drain contact openings to form source and drain contacts, respectively, with the source and drain contact regions. The source and drain contact regions for the first FinFET transistor are positioned adjacent the channel region. The source contact region for the second transistor is positioned adjacent the channel region and the drain contact region for the second FinFET transistor is positioned offset from the channel region by a portion of the raised drain region defining a laterally diffused metal oxide semiconductor (LDMOS) configuration.

BRIEF DESCRIPTION OF THE DRAWINGS

For a better understanding of the embodiments, reference will now be made by way of example only to the accompanying figures in which:

FIGS. 1-16B show process steps for the formation of a FinFET device having a laterally diffused metal oxide semiconductor (LDMOS) configuration.

DETAILED DESCRIPTION OF THE DRAWINGS

Reference is now made to FIGS. 1-16B showing process steps for the formation of a FinFET device having a laterally diffused metal oxide semiconductor (LDMOS) configuration. It will be understood that the illustrations provided do not necessarily show the features drawn to scale.

The process starts with a substrate 10 as shown in FIG. 1. The substrate 10 may comprise a silicon on insulator (SOI) substrate wafer of a conventional type (including an extremely thin silicon on insulator (ETSOI) or an ultra-thin body and buried oxide (UTBB) silicon on insulator (SOD) known to those skilled in the art). Alternatively, the substrate 10 may comprise a bulk semiconductor substrate wafer. The top semiconductor layer of the SOI substrate or the semiconductor material of the bulk substrate may be doped as appropriate for the integrated circuit application. In an embodiment of an SOI substrate, the top semiconductor layer may be of the fully depleted (FD) configuration. The bulk substrate may include, for example, a number of epitaxially grown semiconductor layers. The process techniques described herein are equally applicable to SOI and bulk substrates, as well as other types of substrate, and thus a generic representation of the substrate 10 is shown in FIG. 1 and referenced throughout the description.

Figure 2B:
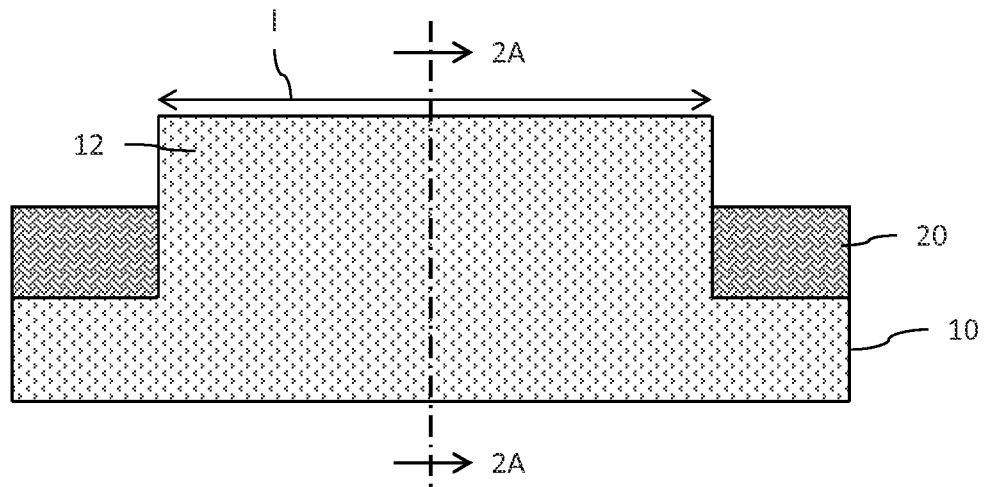

Using fabrication techniques well known to those skilled in the art, a plurality of fins 12 of semiconductor material are formed at the top surface of the substrate 10. The result of the fin fabrication process is shown in cross-sectional FIGS. 2A and 2B, wherein the illustrated orientations of FIGS. 2A and 2B are orthogonal to each other. The fins 12 may, for example, be made of silicon, silicon-germanium, or other suitable semiconductor materials. The fins 12 may, for example, be doped as appropriate for the integrated circuit application. The fins may be separated from each other by a dielectric or other insulating material 20.

Figure 3C:
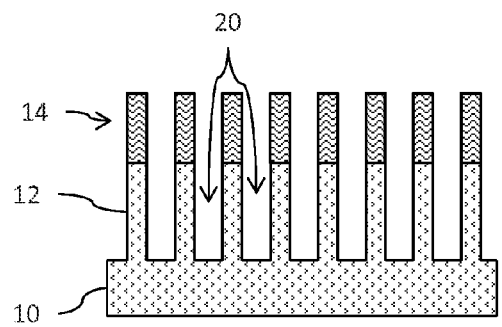
Figure 3D:
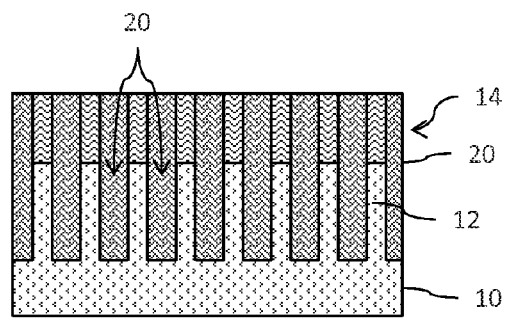
Figure 3E:
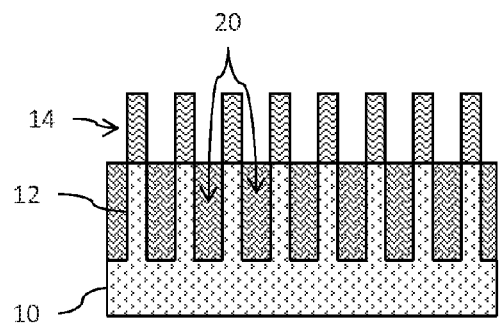
Figure 3F:
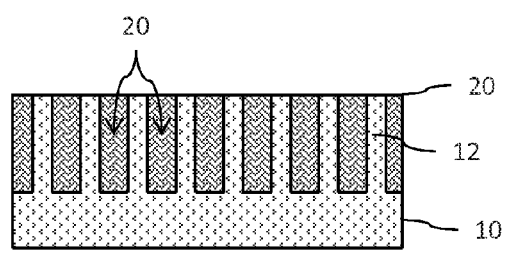
Figure 3G:
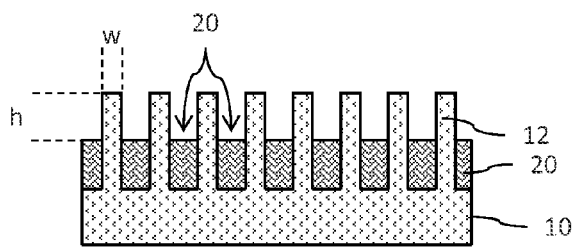

An example of the process for fin fabrication is shown in FIGS. 3A-3G. In FIG. 3A, a hard mask layer 14 (for example, of silicon nitride SiN) is deposited on the substrate 10. Over the hard mask layer 14, a lithographically patterned mask 16 is formed on the hard mask layer 14. The mask 16 includes a number of mask openings 18 with the lithographic patterning leaving hard mask material at locations where fins 12 are desired. An etching operation is then performed through the openings 18 to define a plurality of apertures 20 in the top surface of the substrate 10 which define the fins 12. The lithographically patterned mask 16 is then removed as shown in FIG. 3C. A dielectric material 22 is then deposited to fill the apertures 20 as shown in FIG. 3D. An upper portion of the dielectric material 22 is then removed through a recessing operation to expose the remaining portions of the hard mask layer 14 as shown in FIG. 3E. The remaining portions of the hard mask layer 14 are then stripped away as shown in FIG. 3F. The upper portion of the remaining dielectric material 22 is then partially recessed to expose the upper portions of the fins 12 as shown in FIG. 3G.

The individual fins 12 may have an exposed height "h" of 30-50 nm and a width "w" of 6-12 nm. The length "l" of each fin 12 is determined by the application of the transistor and may, for example, be 50-100 µm.

The substrate 10 may be divided into a number of different regions. FIG. 2A illustrates the provision of a first region 30 including a plurality of fins 12 and a second region 32 including a plurality of fins 12. The first region 30 may, for example, be associated with the formation of a FinFET transistor having a conventional configuration for use in a CMOS logic circuit application, while the second region 32 may, for example, be associated with the formation of a FinFET transistor having a laterally diffused metal oxide semiconductor (LDMOS) configuration for use in a high power or radio frequency (RF) circuit application.

Depending on substrate type and configuration, as well as the circuit application, an isolation structure 34 may be required to separate the first region 30 from the second region 32. The structure 34 may, for example, comprise a shallow trench isolation (STI) as well known to those skilled in the art.

Figure 4A:
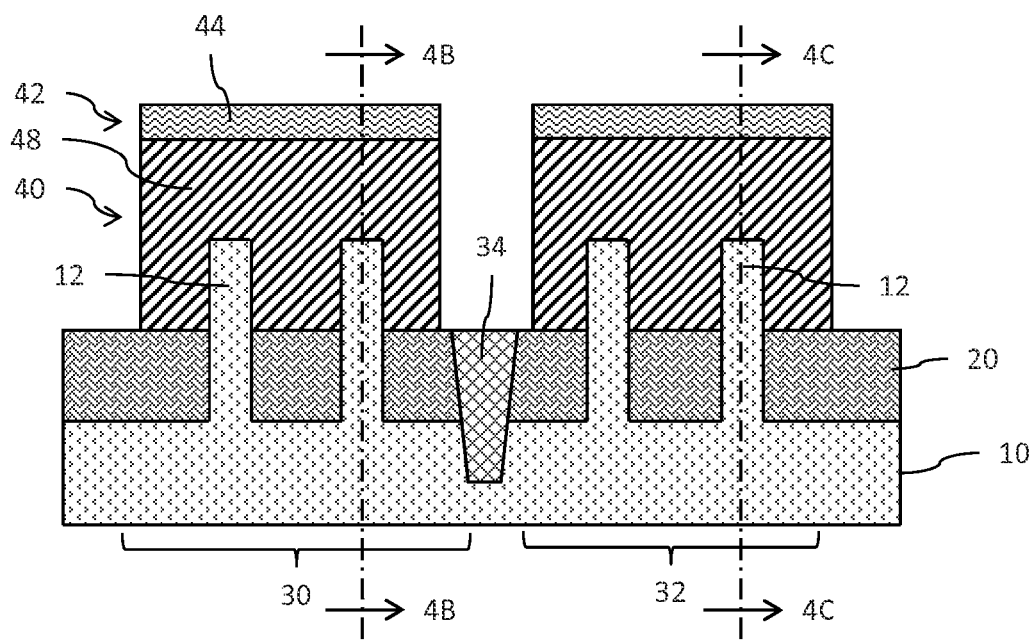
Figure 4B:
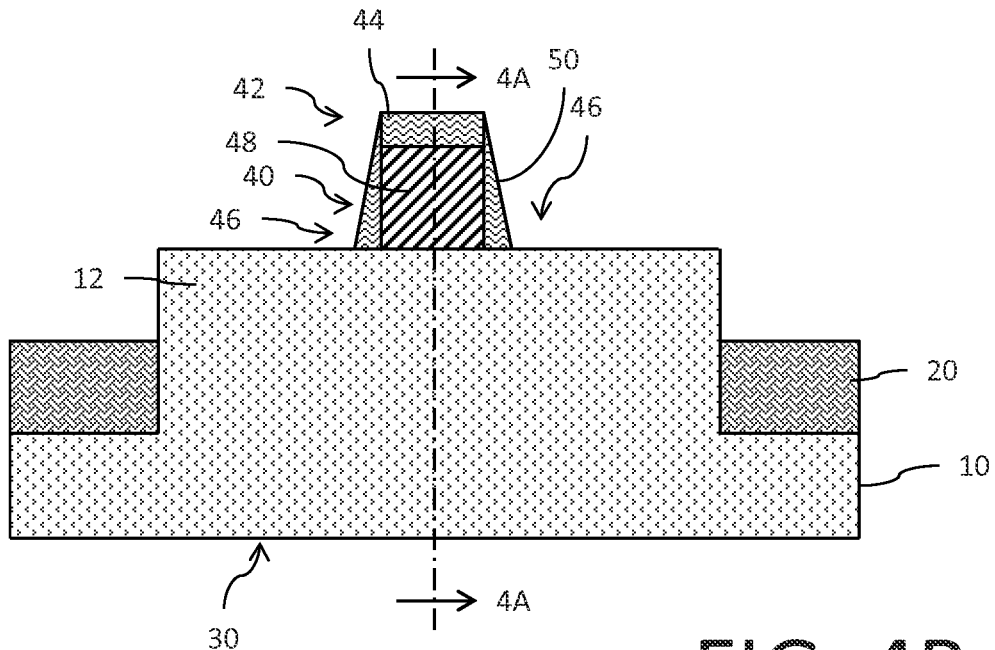
Figure 4C:
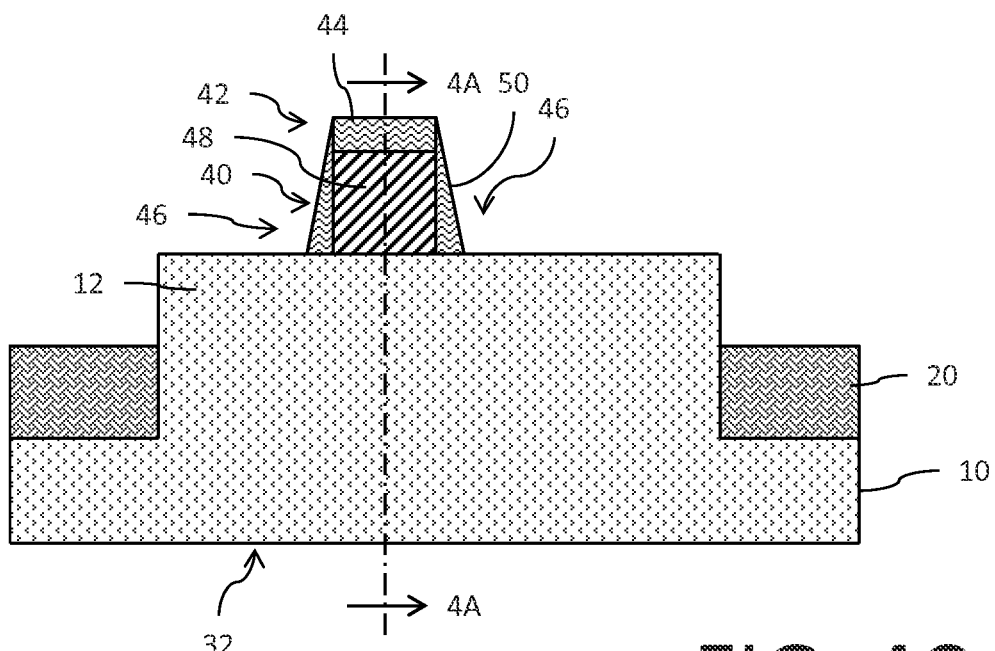

Reference is now made to FIGS. 4A-4C. A sacrificial polysilicon material 40 is deposited using a conventional chemical vapor deposition (CVD) process on the substrate 10 to cover the fins 12 (and the dielectric 22). The polysilicon material 40 may, in an alternative implementation, instead comprise amorphous silicon. A conformal oxide (not explicitly shown) may be formed on the exposed surfaces of the fins 12 prior to deposition of the polysilicon material 40. As understood by those skilled in the art, the polysilicon material (with the oxide) is associated with the formation of structures commonly referred to as "dummy gate" structures. The polysilicon material of the dummy gate structures will be subsequently removed later in the fabrication process and replaced with a metal gate stack defining the actual operating gate electrode for the transistor devices. Thus, there is no need to dope the polysilicon material 40. The deposit of the polysilicon material 40 will have a height in excess of the height of the fins 12 so that the fins will be completely covered. The material 40 may have a thickness, for example, of 100-150 nm. The top surface of the polysilicon material 40 deposit is polished using conventional chemical-mechanical planarization (CMP) techniques to provide a planar top surface.

A hard mask layer 42 with a thickness of 20-50 nm is deposited on the planar top surface of the polysilicon material 40 using a chemical vapor deposition (CVD) process. The layer 42 is lithographically patterned in a manner well known to those skilled in the art to leave mask material 44 at desired locations for the dummy gate structures. A reactive ion etch (RIE) is then performed to open apertures 46 in the polysilicon material on either side of the dummy gate 48. The structure of the dummy gate 48 may be considered to straddle over a fin 12, or over a plurality of adjacent fins, at a channel region as described herein.

A silicon nitride material is then deposited, for example, using an atomic layer deposition (ALD) technique as known in the art, and subsequently etched to leave sidewall spacers 50 on the side walls of the polysilicon dummy gate 48.

The dummy gate structure accordingly comprises a patterned polysilicon (or amorphous silicon) dummy gate 48, an overlying silicon nitride cap (formed by the mask material 44) and sidewall spacers 50.

Figure 5A:
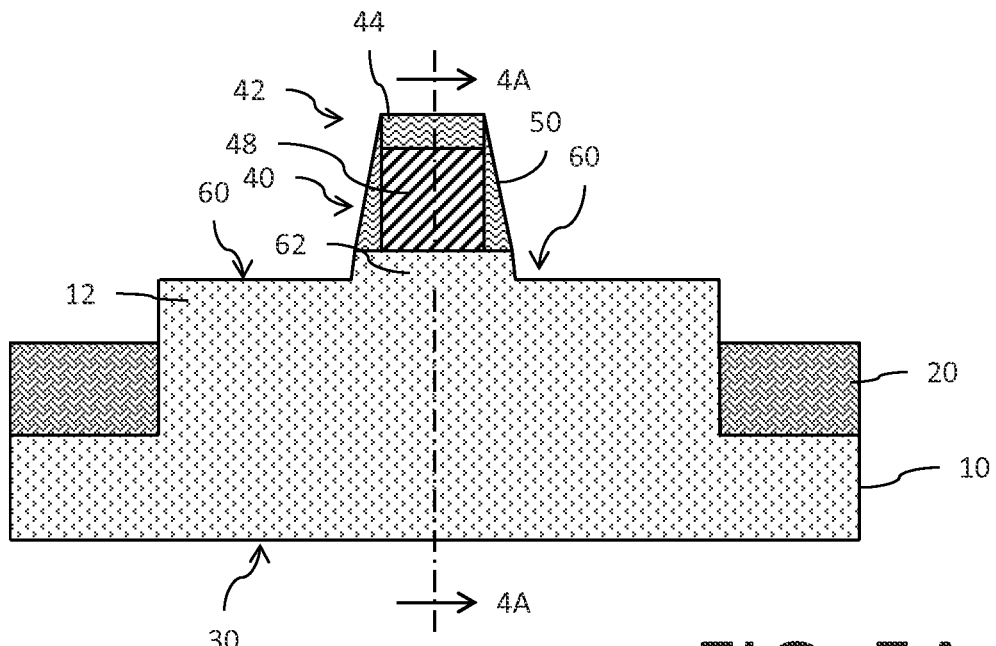
Figure 5B:
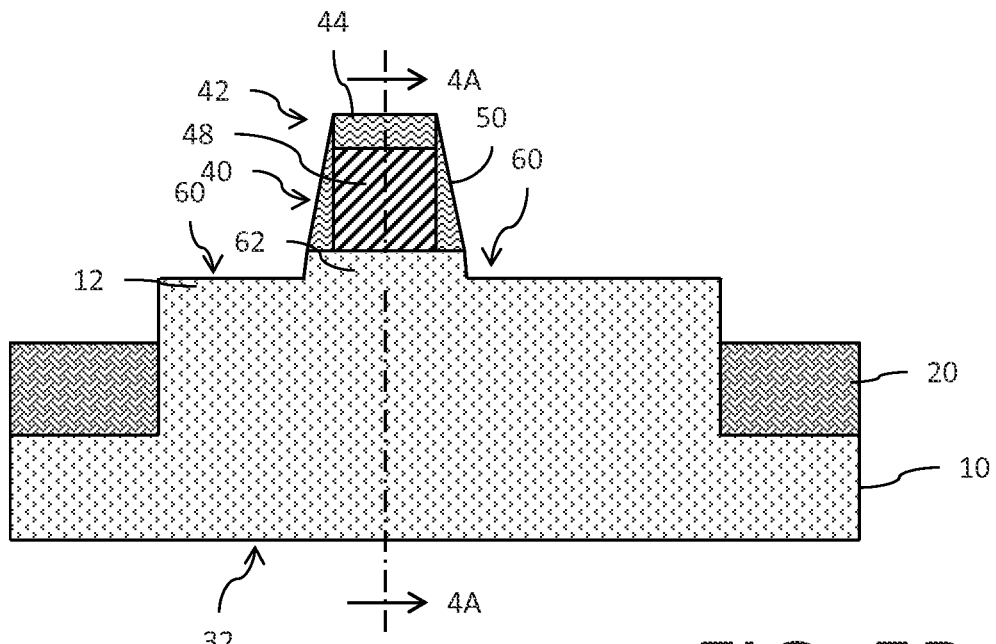

Reference is now made to FIGS. 5A-5B. An etch is then performed to recess 60 the fins 12 on either side of the dummy gate structures. The etch may, for example, comprise an anisotropic (HBr) etch. The depth of the recess 60 may, for example, comprise 20-40 nm. The portion 62 of the fin 12 located under the fin 12 between the recess 60 regions defines a channel region of the FinFET transistor.

Figure 6A:
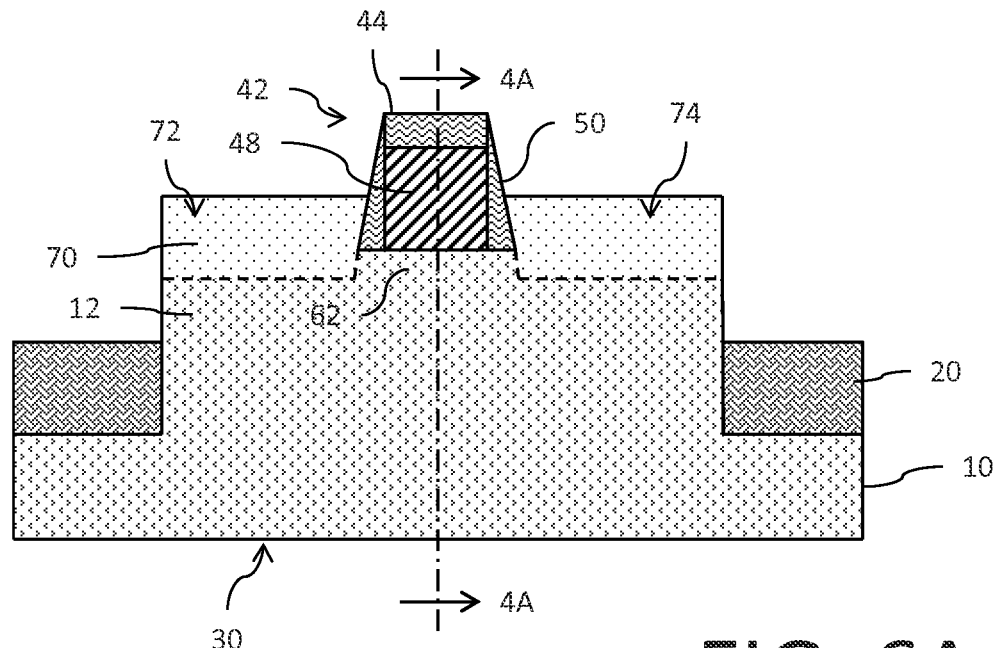
Figure 6B:
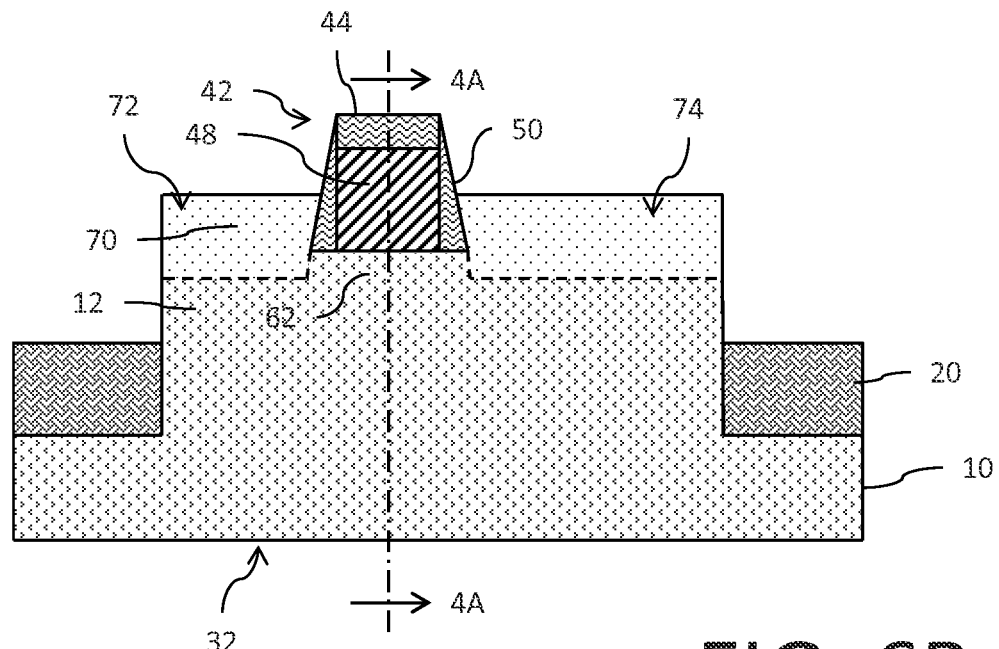

Using an epitaxial process tool and starting from the exposed top surface of the fins 12 in the recess 60 region, an epitaxial growth 70 of a silicon-based semiconductor material is made. The epitaxial growth 70 not only fills the recess 60 regions (adjacent the channel portion 62) but further extends above the previous top surface of the fins to regions adjacent the sidewall spacers 50 on either side of the dummy gate structures. The silicon-based epitaxial growth 70 may be in situ lightly doped as needed for a given application. As a result of the epitaxial growth 70, raised source and drain regions 72 and 74, respectively, are formed on either side of the dummy gate structures. The result is shown in FIGS. 6A-6B. The epitaxial growth 70 may comprise, for example: silicon lightly doped with boron or indium; silicon-germanium lightly doped with boron or indium; silicon lightly doped with phosphorous or arsenic; or silicon-carbide lightly doped with phosphorous or arsenic. In this context, lightly doped means a doping concentration of $1 \times 10^{19}$ to $9 \times 10^{19}$ cm$^{-3}$ with respect to an active dopant. It will be understood that different regions of the substrate may utilize different materials for the epitaxial growth to account for, for example, the need to make transistors of the n-channel or p-channel type.

Figure 7A:
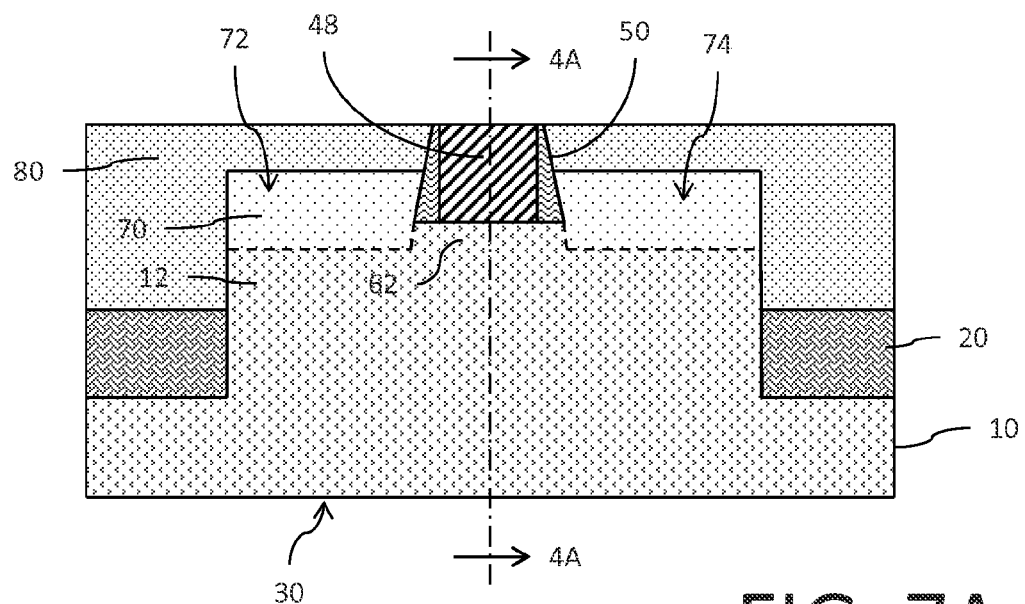
Figure 7B:
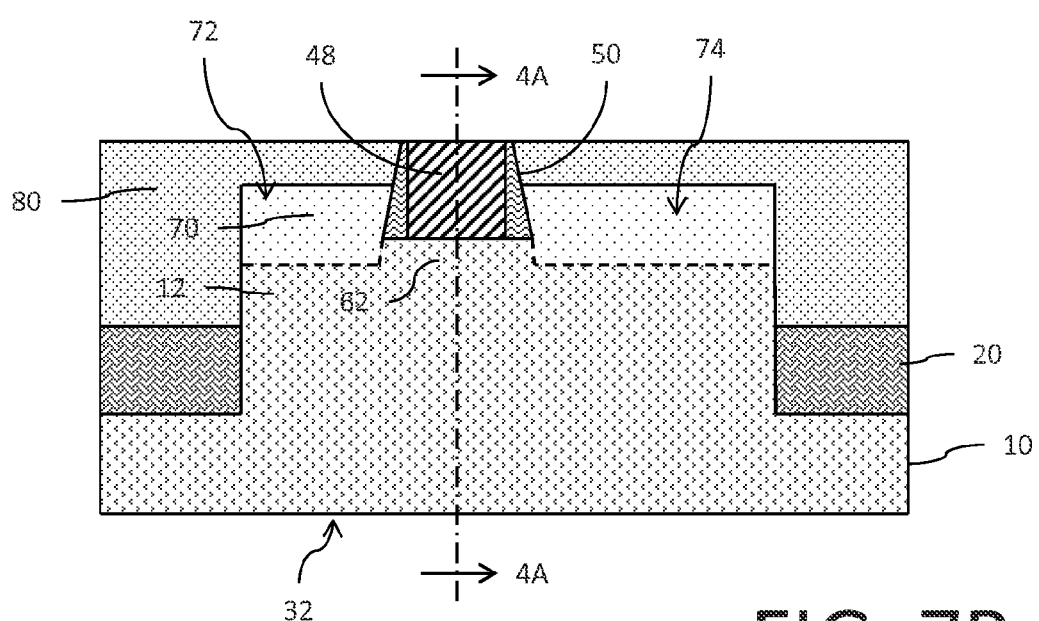

Reference is now made to FIGS. 7A-7B. A silicon dioxide material 80 is deposited to cover the substrate. The material 80 may be further processed using conventional chemical-mechanical planarization (CMP) techniques to provide a planar top surface that stops at the top of the dummy gate 48.

Figure 8A:
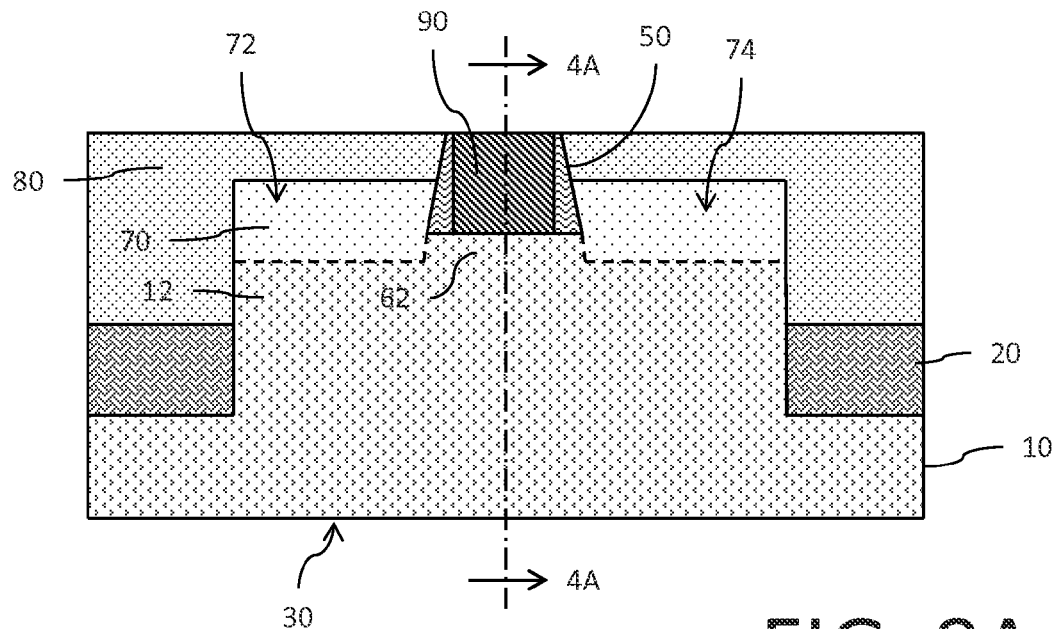
Figure 8B:
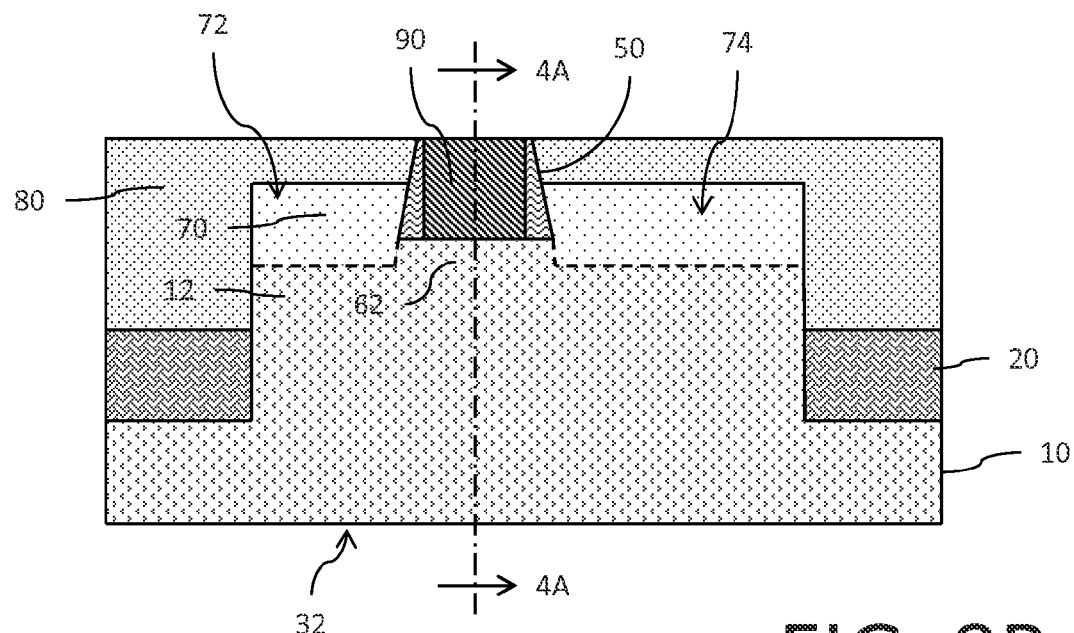

Using a selective removal process (such as an ammonium hydroxide etch), the dummy gate 48 is removed. The removed dummy gate 48 is then replaced with a metal gate structure 90. In an example, the metal gate structure may comprise a high-K dielectric liner (forming the gate dielectric for the transistor) deposited using an atomic layer deposition (ALD) process with a thickness of 1-2 nm, a work function metal deposited using a chemical vapor deposition process and a contact metal fill deposited using a chemical vapor deposition process. The result is shown in FIGS. 8A-8B.

Figure 9A:
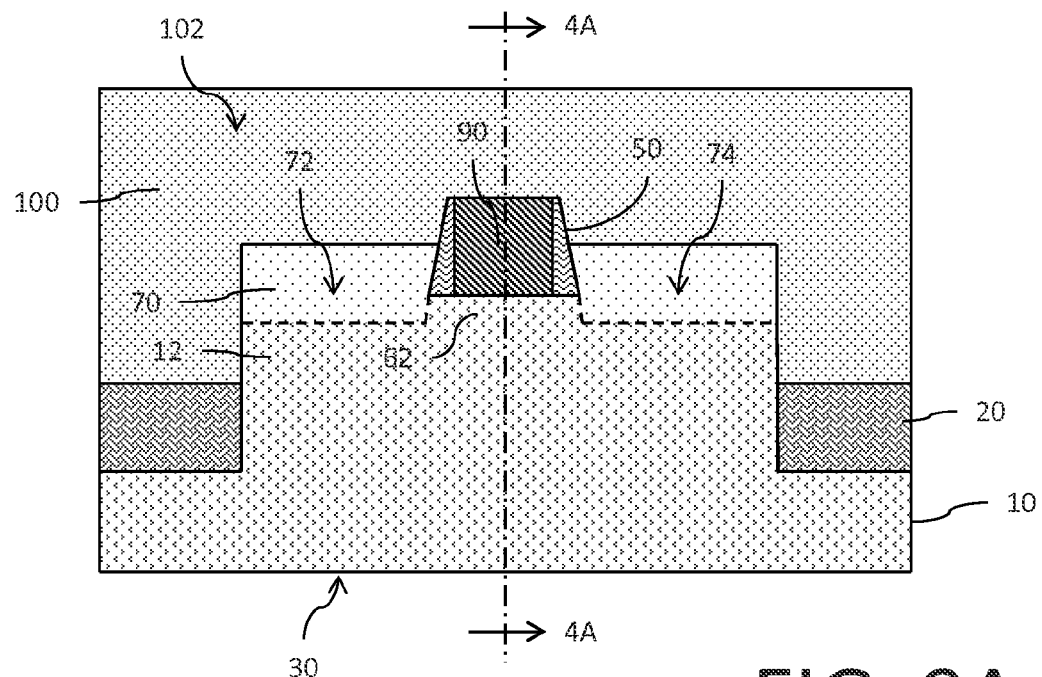
Figure 9B:
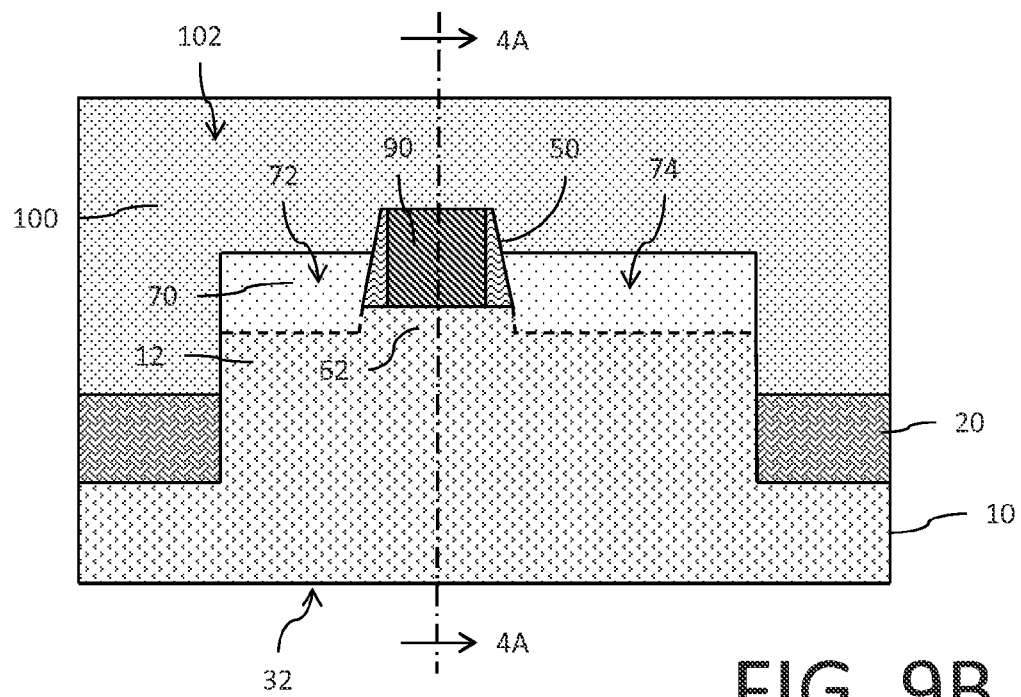

Additional silicon dioxide material 100 is then deposited to complete the formation of the pre-metallization dielectric (PMD) level 102 for the integrated circuit. The material 100 may be further processed using conventional chemical-mechanical planarization (CMP) techniques to provide a planar top surface. The result is shown in FIGS. 9A-9B.

Figure 10A:
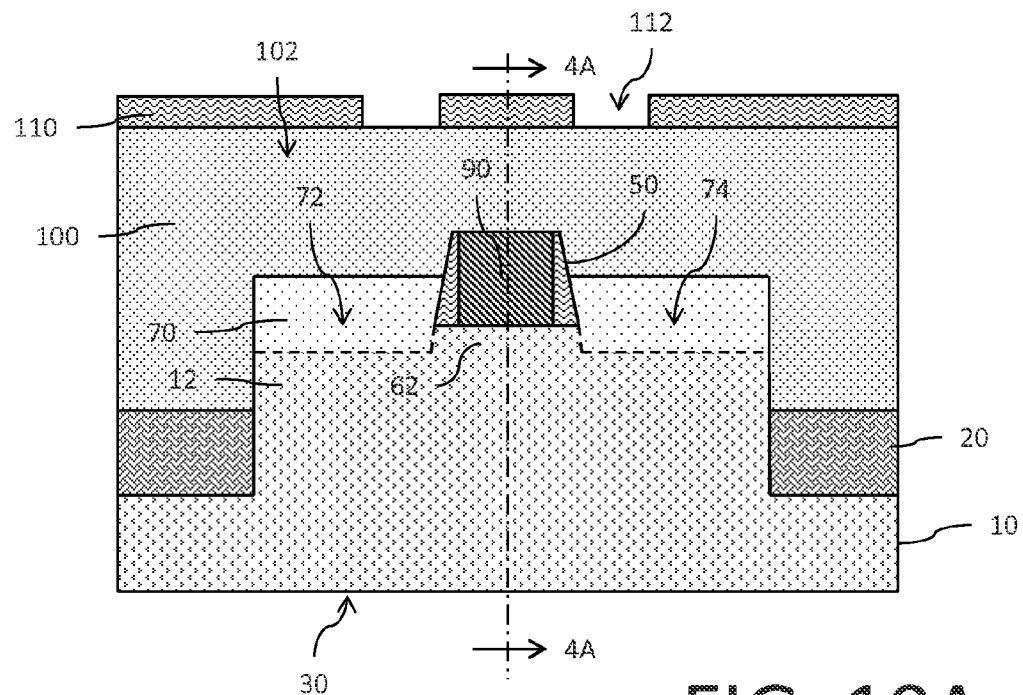
Figure 10B:
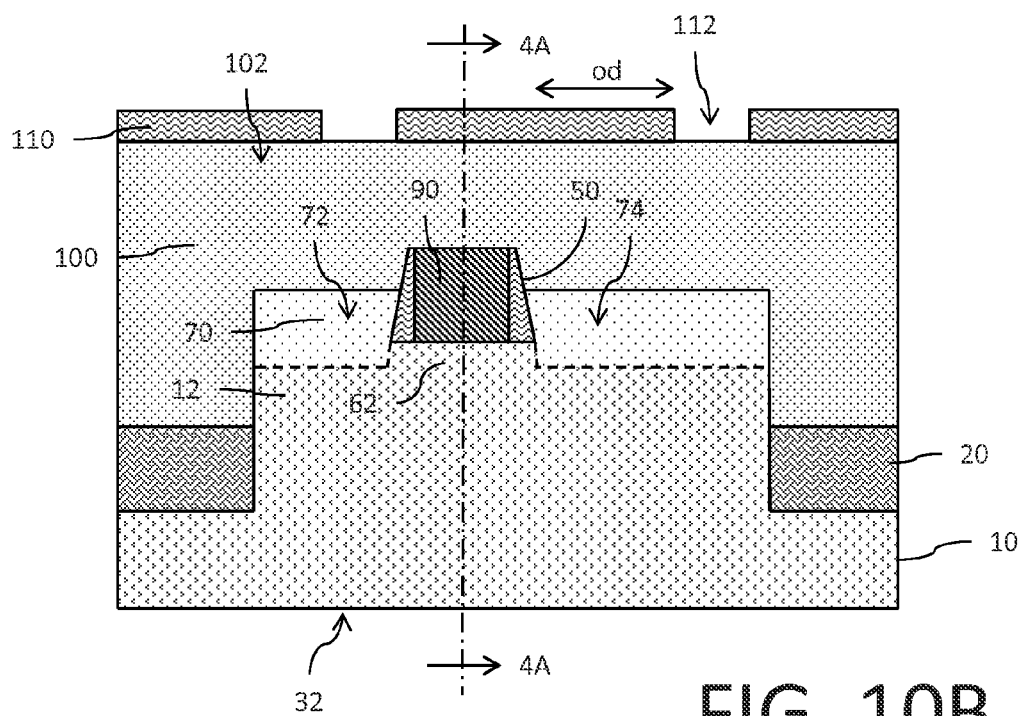
Figure 11A:
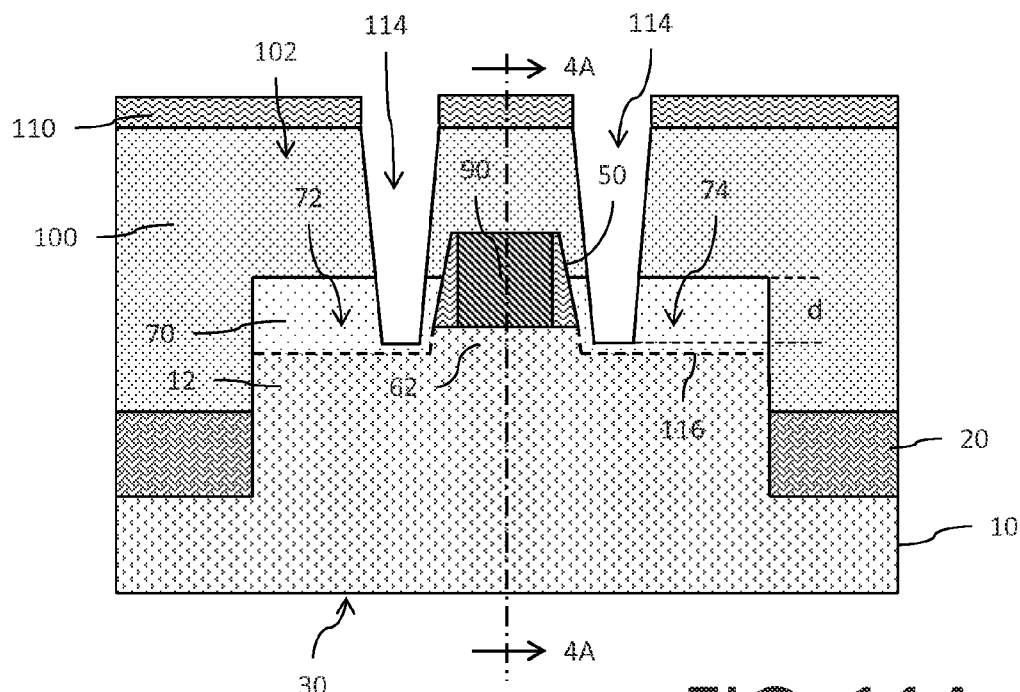
Figure 11B:
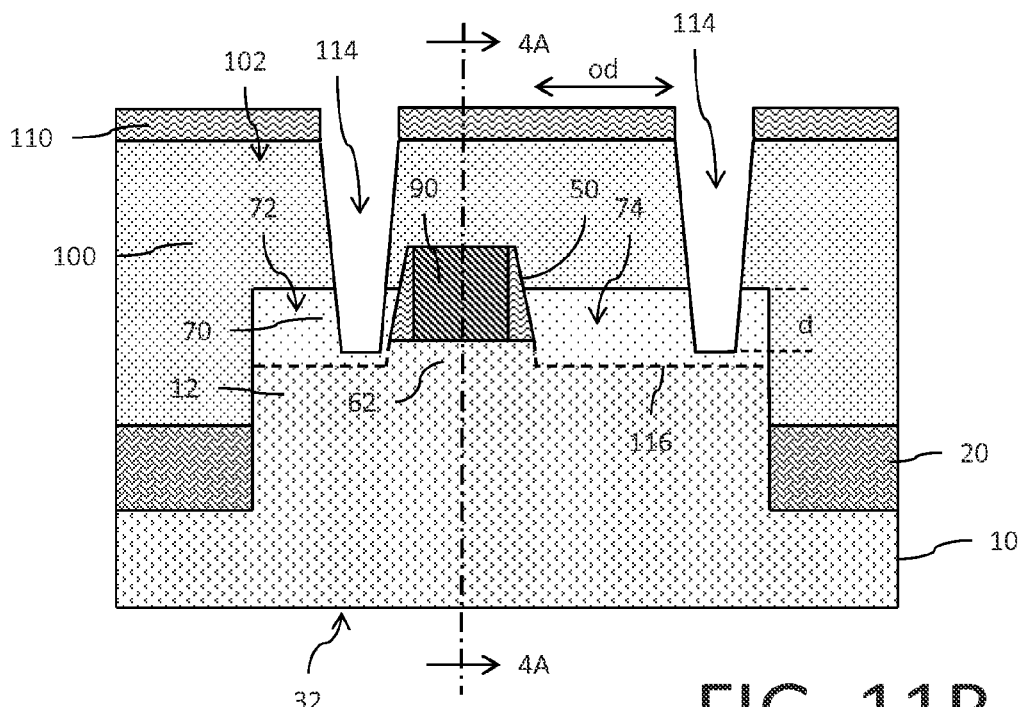

A hard mask layer 110, for example an organic planarization layer (OPL) having a thickness of 100-500 nm, is then deposited on the planar top surface of the PMD layer 102 using a coating process. The layer 110 is lithographically patterned in a manner well known to those skilled in the art to form openings 112 at desired locations for making electrical contact to the source and drain regions 72 and 74, respectively. With respect to the region 30, as shown in FIG. 10A, the openings 112 are aligned at positions adjacent the sidewall spacers 50 for the gate structure. With respect to the region 32, as shown in FIG. 10B, the opening for the source region 72 is aligned at a position adjacent the sidewall spacer 50 on the source side of the gate structure, while the opening for the drain region 74 is offset by an offset distance "od" from the sidewall spacer 50 on the drain side of the gate structure. In an example, for a transistor with a channel length of 100-250 nm the offset distance may comprise 1-10 µm. The size of the offset distance is dependent on the doping level of the lightly doped drain region 74 and the breakdown voltage target for the specific LDMOS configuration.

A reactive ion etch (RIE) is then performed to open and extend apertures 114 completely through the pre-metallization dielectric (PMD) 102 (materials 80 and 100) and which penetrate into the lightly doped epitaxial growth 70 material to a depth "d". The depth d may, in an embodiment, extend down to reach or even pass the bottom 116 of the recess 60 of the fins 12 on either side of the dummy gate structures (see, FIGS. 5A-5B). Indeed, in a preferred implementation for the transistors in the region 30, which for example may be well suited for use in CMOS logic circuitry, the depth d should reach the bottom 116 and the opening should be positioned as close as possible to the channel region 62. It is less important for the transistors in the region 32, which for example will exhibit the LDMOS configuration, for the depth d to reach the bottom 116.

The mask layer 110 is then removed.

Figure 12A:
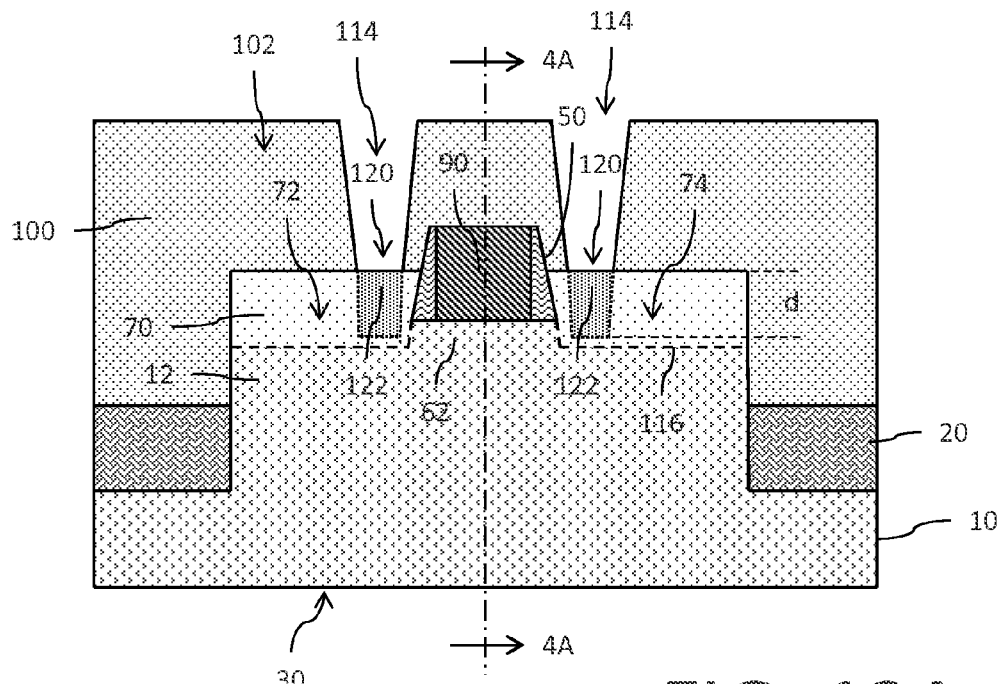
Figure 12B:
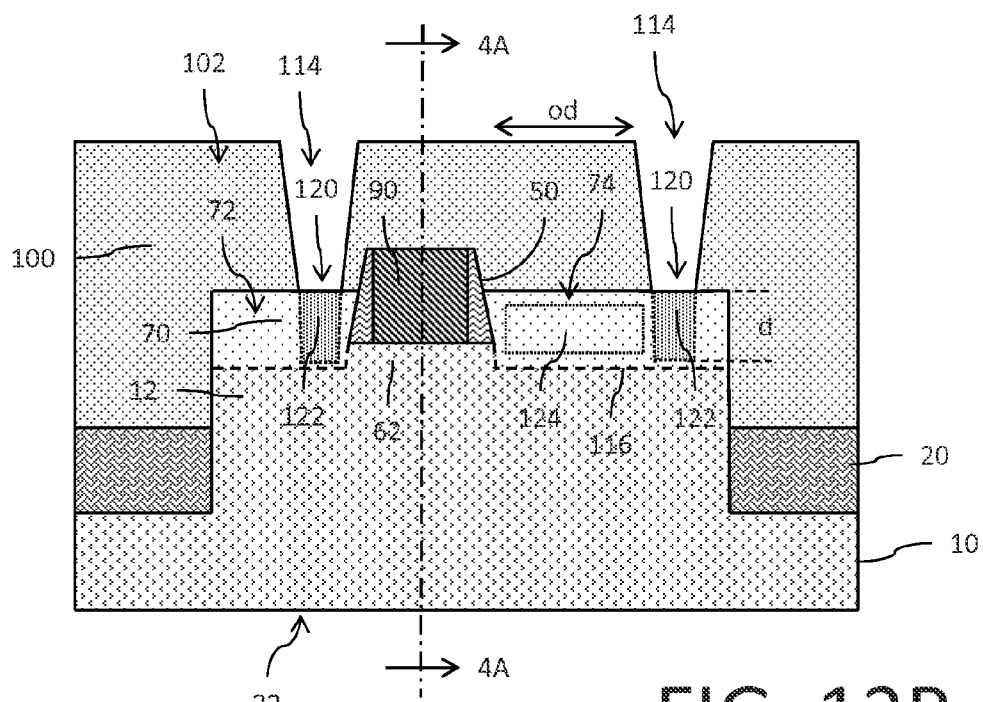

Using an epitaxial process tool and starting from the exposed top surface of the epitaxial growth 70 regions at the bottom of the apertures 114, an epitaxial growth 120 of a silicon-based semiconductor material is made. The epitaxial growth 120 at least fills the portion of the apertures 114 in the epitaxial growth 70 regions (and may extend above the top surface of the epitaxial growth regions 70). The silicon-based epitaxial growth 120 is in situ heavily doped as needed for a given application so as to reduce source-drain sheet resistance. As a result of the epitaxial growth 120, epitaxial contacts 122 are formed in the source and drain regions 72 and 74, respectively. The result is shown in FIGS. 12A-12B. The epitaxial growth 120 may comprise, for example: silicon heavily doped with boron or indium; silicon-germanium heavily doped with boron or indium; silicon heavily doped with phosphorous or arsenic; or silicon-carbide heavily doped with phosphorous or arsenic. In this context, heavily doped means a doping concentration of $1 \times 10^{20}$ to $1 \times 10^{21}$ cm$^{-3}$ with respect to an active dopant.

With specific reference to FIG. 12A and the transistors of the region 30, the epitaxial contacts 122 for the source and drain regions (72, 74) are immediately adjacent the channel region 62. For the transistors of region 32 as illustrated in FIG. 12B, however, the epitaxial contact 122 for the source region 72 is immediately adjacent the channel region 62, but the epitaxial contact 122 for the drain region is offset by the offset distance "od" from the channel region with the intervening portion 124 of the drain region 74 defining the laterally diffused metal oxide semiconductor (LDMOS) configuration. In this configuration, the intervening portion 124 of the drain region 74 provides a high resistivity drain extension that is useful in transistors operating at higher voltages.

Figure 13A:
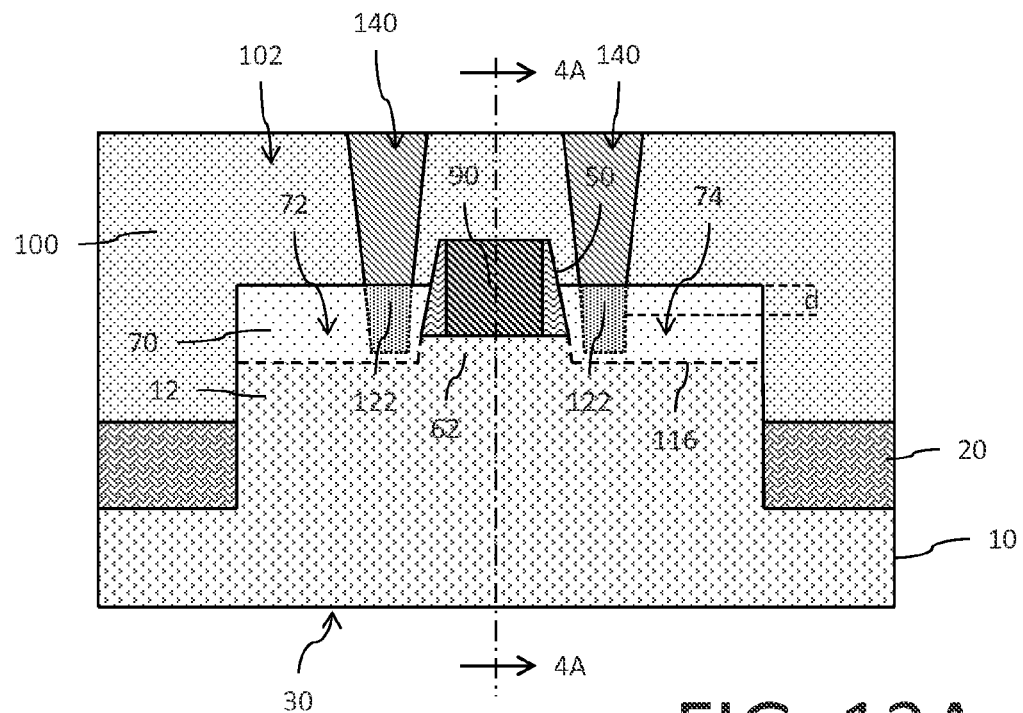
Figure 13B:
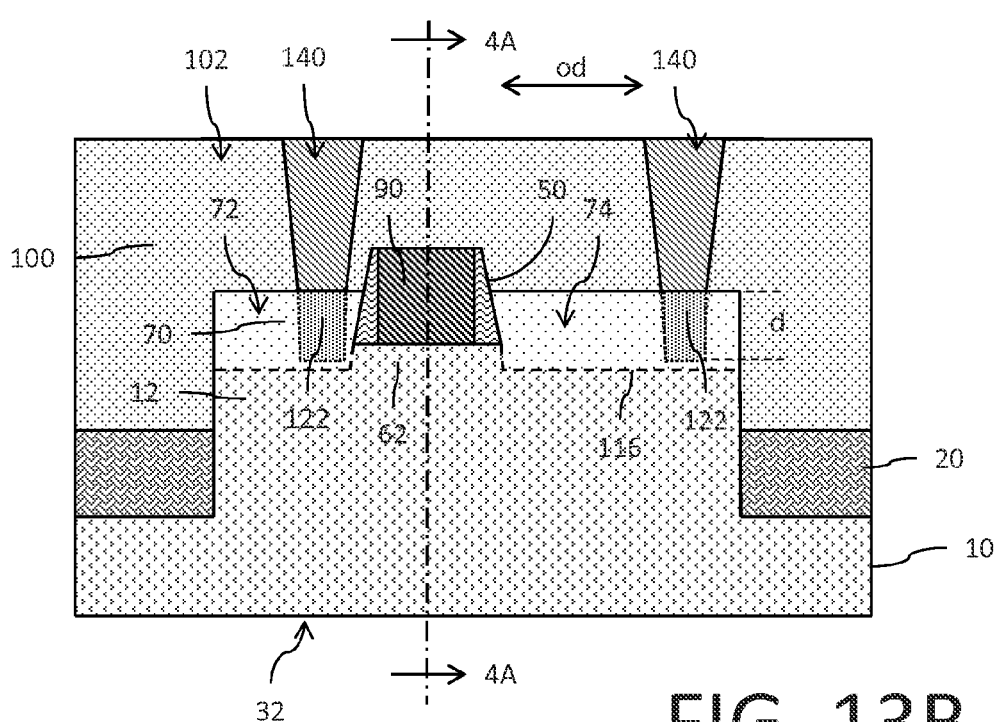

Reference is now made to FIGS. 13A-13B. The remaining portions of the apertures 114 are then filled with metal material(s) to define a contact 140 made to the source and drain regions of the transistor. As necessary, a conventional chemical-mechanical planarization (CMP) technique may be used to remove excess metal so as to provide a planar top surface. The metal materials defining the contact 140 may, for example, comprise tungsten deposited using a chemical vapor deposition process.

The fabrication process is compatible with the formation of a silicide at the bottom of the contact 140. The techniques for salicidation are well known to those skilled in the art. The silicide may, for example, comprise a typical nickel platinum silicide or alternatively a silicide arising from the use of a titanium nitride liner for the contact 140.

Figure 14A:
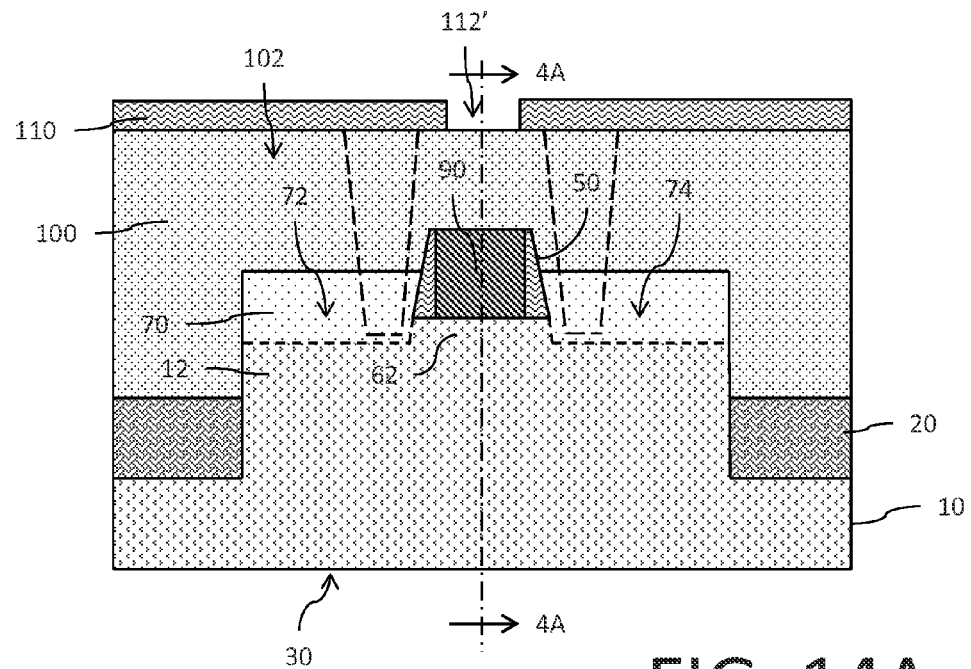
Figure 14B:
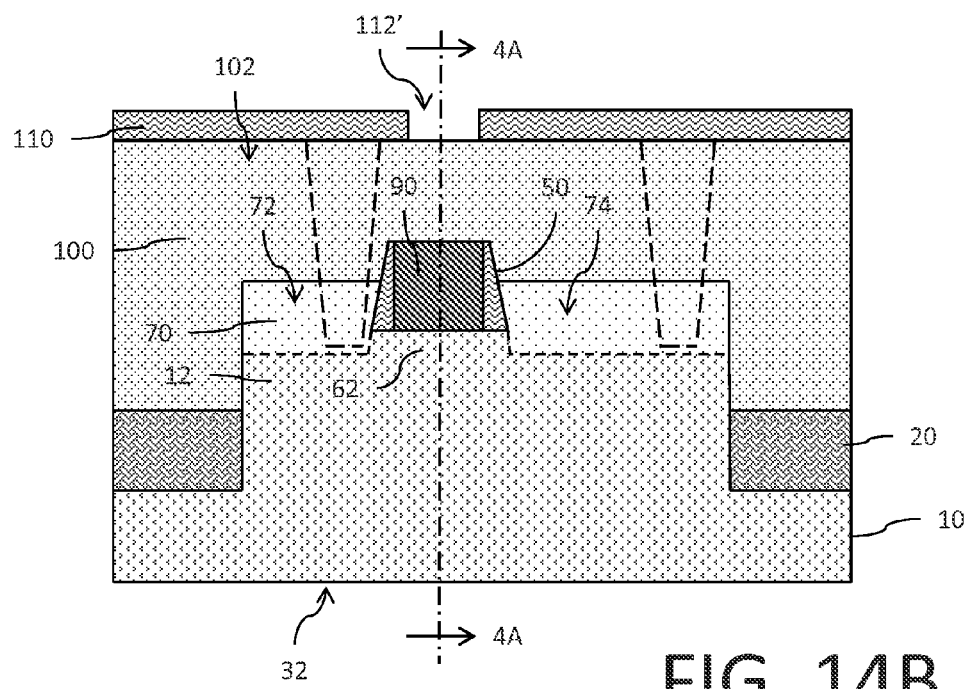

The hard mask layer deposited on the planar top surface of the PMD layer 102 may also be lithographically patterned in a manner well known to those skilled in the art to form openings 112' at desired locations for making electrical contact to the gate regions. This is shown in FIGS. 14A-14B. It is noted that the openings 112' shown in FIGS. 14A-14B may be formed in a different plane than the openings 112 shown in FIGS. 10A-10B, or if space allows may be formed in the same plane. This is indicated by the dotted lines for the source/drain epi growths and contacts.

Figure 15A:
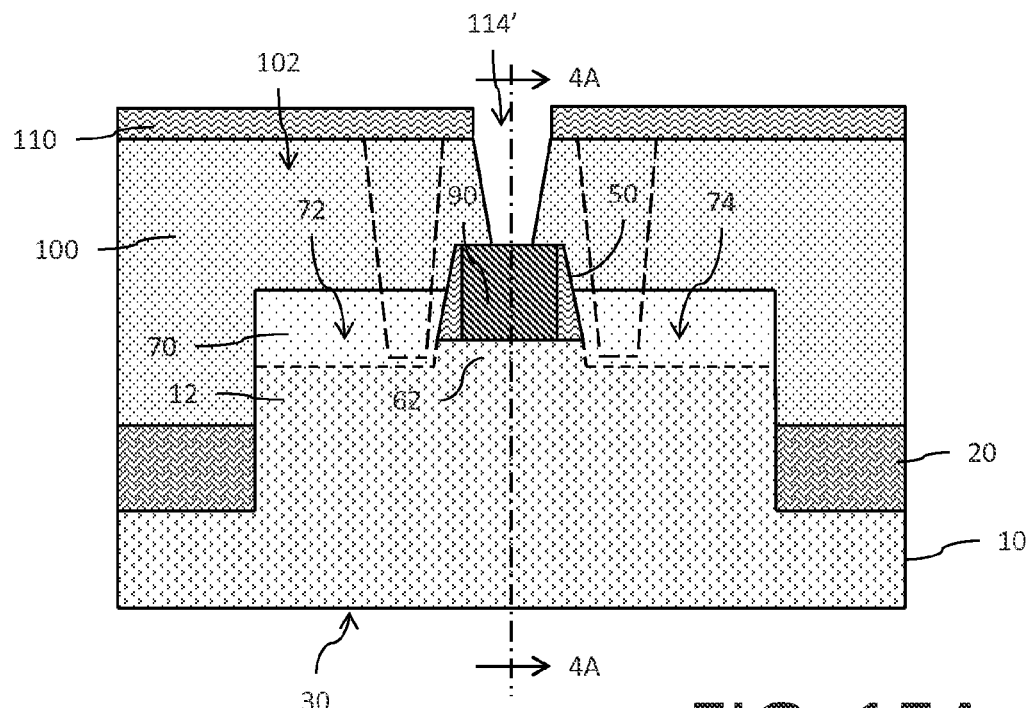
Figure 15B:
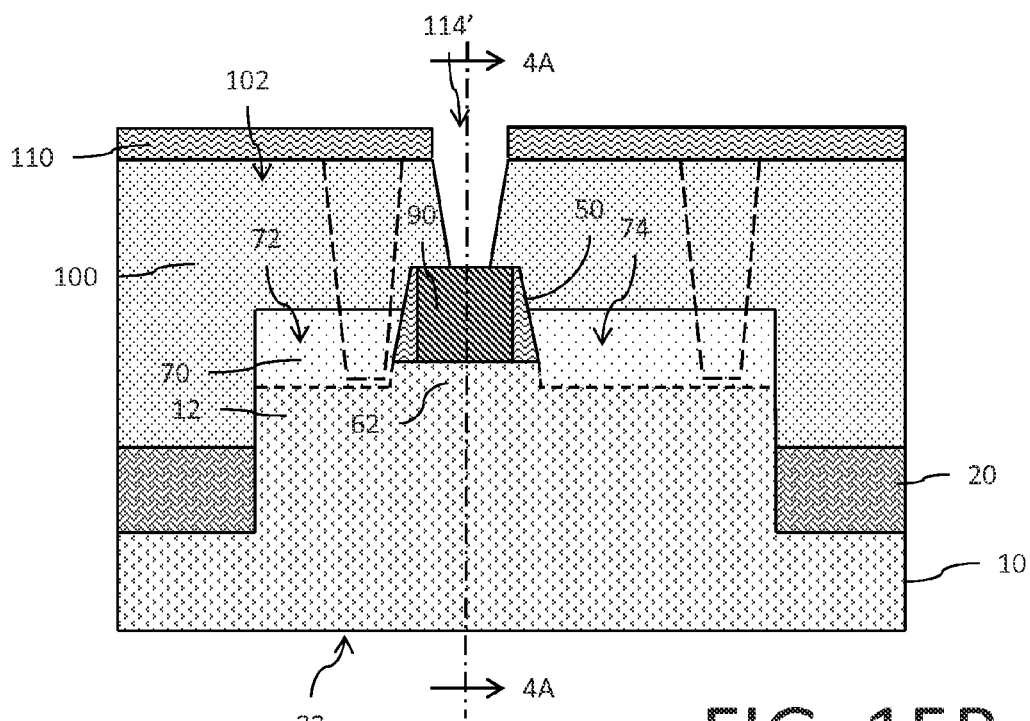

A reactive ion etch (RIE) is then performed to open and extend apertures 114' completely through the pre-metallization dielectric (PMD) 102 (material 100) to reach an upper conductive surface of the metal gate structure 90. The result is shown in FIGS. 15A-15B. It will be understood that the etching operations of FIGS. 11A-11B and 15A-15B may occur simultaneously.

Figure 16A:
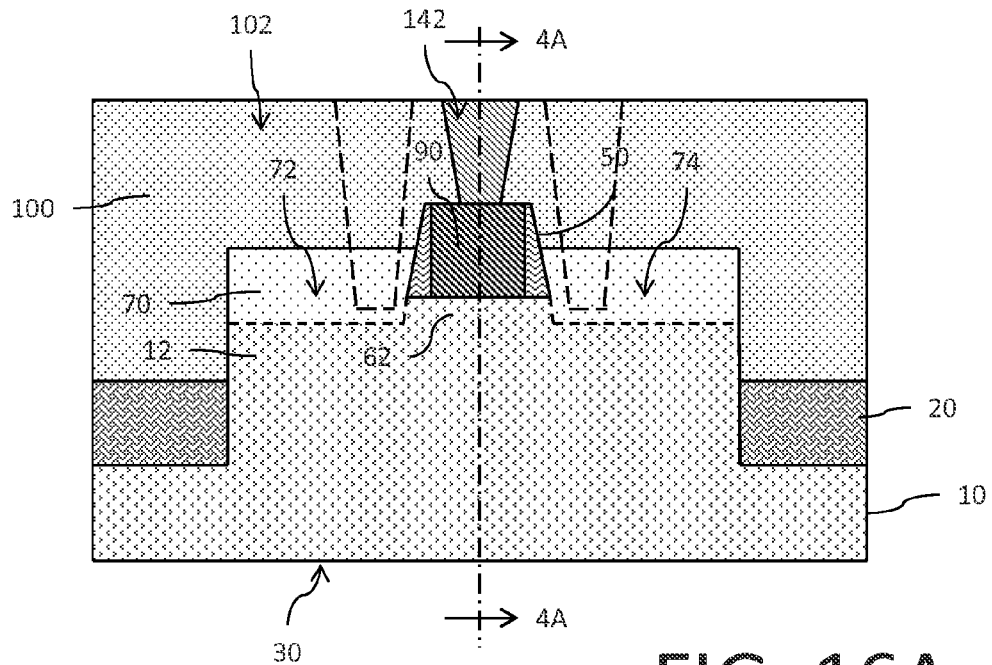
Figure 16B:
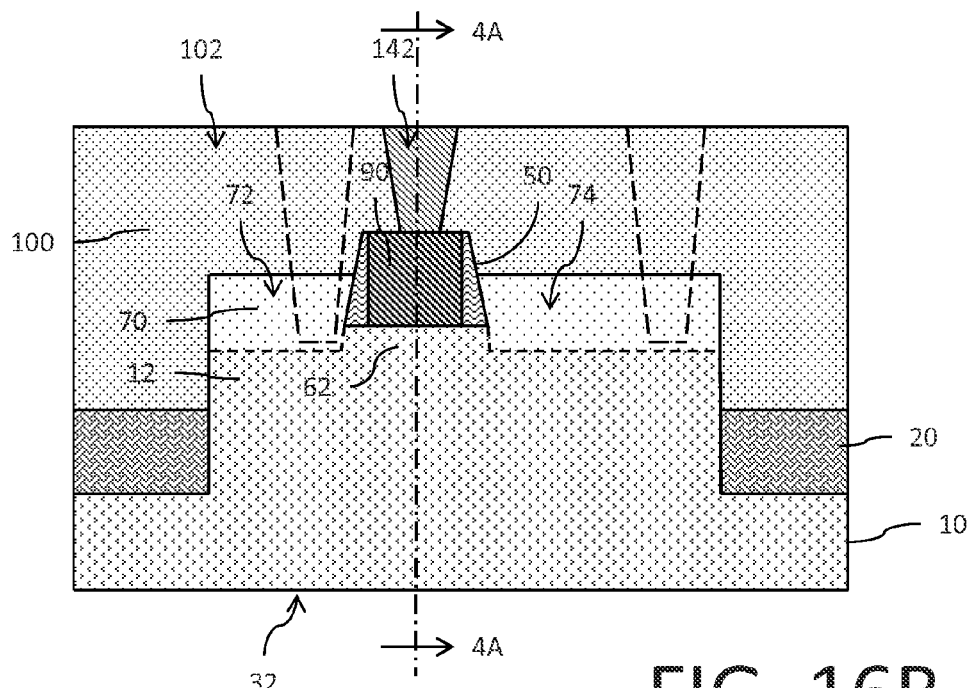

The apertures 114' are then filled with metal material(s) to define a contact 142 made to the metal gate structure 90 of the transistor. The result is shown in FIGS. 16A-16B. It will be understood that the filling operations of FIGS. 13A-13B and 16A-16B may occur simultaneously. As necessary, a conventional chemical-mechanical planarization (CMP) technique may be used to remove excess metal so as to provide a planar top surface. The metal materials defining the contact 142 may, for example, comprise tungsten deposited using a chemical vapor deposition process.

At this point, front end of line (FEOL) fabrication of the integrated circuit is complete. Further back end of line (BEOL) processing to fabricated metallizations and interconnects may then be performed as well known to those skilled in the art.

Although making and using various embodiments are discussed in detail herein, it should be appreciated that as described herein are provided many inventive concepts that may be embodied in a wide variety of contexts. Embodiments discussed herein are merely representative and do not limit the scope of the invention.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A method for manufacturing a FinFET transistor, comprising:
   forming a fin of semiconductor material;
   forming a transistor gate structure extending over a channel region of said fin;
   epitaxially growing first epitaxial growth material on a top of said fin on a first side and second side of the transistor gate electrode to form a raised source region and a raised drain region, respectively;
   depositing a pre-metallization dielectric material to cover the raised source region, transistor gate electrode and raised drain region;
   extending a source contact opening through the pre-metallization dielectric material to said raised source region;
   extending a drain contact opening through the pre-metallization dielectric material to said raised drain region;
   epitaxially growing second epitaxial growth material at a bottom of the source and drain contact openings to extend from said first epitaxial growth material to form a source contact region and a drain contact region, respectively; and
   filling the source and drain contact openings with metal to form source and drain contacts, respectively, with the source and drain contact regions;
   wherein the first epitaxial growth material is doped with a first concentration and wherein said second epitaxial growth material is doped with a second concentration, said second concentration being higher than said first concentration.

2. The method of claim 1, wherein forming the transistor gate structure comprises:
   forming a dummy gate structure;
   removing the dummy gate structure after deposition of the pre-metallization dielectric material;
   replacing the removed dummy gate structure with a metal gate electrode.

3. The method of claim 1, wherein forming the fin further comprises:
   forming a first recess region at the top of the fin adjacent the channel region at the first side of the transistor gate electrode; and
   forming a second recess region at the top of the fin adjacent the channel region at the second side of the transistor gate electrode.

4. The method of claim 3, wherein epitaxially growing first epitaxial growth material comprises filling said first and second recess regions with first epitaxial growth material.

5. The method of claim 1, further comprising offsetting the drain contact region of said second epitaxial growth material from the second side of the transistor gate electrode by an offset distance to provide with said raised source region of first epitaxial growth material a laterally diffused metal oxide semiconductor (LDMOS) configuration.

6. The method of claim 2, further comprising:
   in situ doping the first epitaxial growth material to the first concentration; and
   in situ doping the second epitaxial growth material to the second concentration.

7. The method of claim 6, wherein said source and drain contact regions of the second epitaxial growth material exhibit a relatively lower resistivity than the first epitaxial growth material.

8. The method of claim 7, further comprising offsetting the drain contact region of said second epitaxial growth material from the second side of the transistor gate electrode by an offset distance to provide with said raised source region of first epitaxial growth material a relatively higher resistivity drain region between the channel region and the drain contact region.

9. The method of claim 8, wherein the relatively higher resistivity drain region forms a laterally diffused metal oxide semiconductor (LDMOS) configuration.

10. The method of claim 1, wherein extending the source contact opening comprises forming a first recess in said raised source region to form a first recess, and wherein extending the drain contact opening comprises forming a second recess in said raised drain region.

11. The method of claim 10, wherein epitaxially growing second epitaxial growth material comprises filling the first and second recesses with second epitaxial growth material.

12. A method for manufacturing a FinFET transistor, comprising:
   forming a fin of semiconductor material including a fin source region, a fin channel region and a fin drain region;
   epitaxially growing first epitaxial growth material on a top of said fin to form a raised source region on the fin source region and a raised drain region on the fin drain region, respectively;
   depositing a pre-metallization dielectric material to cover the raised source region and raised drain region;

forming a source contact opening through the pre-metallization dielectric material to said raised source region;

forming a drain contact opening through the pre-metallization dielectric material to said raised drain region; and epitaxially growing second epitaxial growth material at a bottom of the source and drain contact openings on said first epitaxial growth material to form a source contact region and a drain contact region, respectively;

wherein the first epitaxial growth material is doped with a first concentration and wherein said second epitaxial growth material is doped with a second concentration, said second concentration being higher than said first concentration.

13. The method of claim 12, wherein forming the fin further comprises:

forming a first recess region on top of the fin at the fin channel region; and forming a second recess region on top of the fin at the fin channel region.

14. The method of claim 13, wherein epitaxially growing first epitaxial growth material comprises filling said first and second recess regions with first epitaxial growth material.

15. The method of claim 12, further comprising:

in situ doping the first epitaxial growth material to the first concentration; and in situ doping the second epitaxial growth material to the second concentration.

16. The method of claim 12, wherein said source and drain contact regions of the second epitaxial growth material exhibit a relatively lower resistivity than the first epitaxial growth material.

17. The method of claim 12, further comprising:

forming a transistor gate structure extending over the fin channel region;

spacing the drain contact opening from a side of the transistor gate electrode by an offset distance sufficient to provide a relatively higher resistivity extension of the drain region between the fin channel region and the drain contact region.

18. The method of claim 17, wherein the relatively higher resistivity extension of the drain region forms a laterally diffused metal oxide semiconductor (LDMOS) configuration.

19. The method of claim 12, wherein epitaxially growing second epitaxial growth material comprises filling the first and second recesses with second epitaxial growth material.

20. The method of claim 12, further comprising depositing metal within the source and drain contact openings to form source and drain contacts, respectively, on the source and drain contact regions.

21. The method of claim 12, further comprising:

forming a dummy gate structure over the fin channel region;

removing the dummy gate structure after deposition of the pre-metallization dielectric material;

replacing the removed dummy gate structure with a metal gate electrode.

22. The method of claim 12, wherein forming the source contact opening comprises extending the source contact opening into the top of the raised source region, and wherein forming the drain contact opening comprises extending the drain contact opening into the top of the raised drain region.

23. A method for manufacturing a transistor, comprising:

epitaxially growing first epitaxial growth material on a top of a transistor source region to form a raised source region on the transistor source region and on a top of a transistor drain region to form a raised drain region on the transistor drain region;

depositing a pre-metallization dielectric material to cover the raised source region and raised drain region;

forming a source contact opening through the pre-metallization dielectric material to said raised source region;

forming a drain contact opening through the pre-metallization dielectric material to said raised drain region; and epitaxially growing second epitaxial growth material at a bottom of the source and drain contact openings on said first epitaxial growth material to form a source contact region and a drain contact region, respectively;

wherein the first epitaxial growth material is doped with a first concentration and wherein said second epitaxial growth material is doped with a second concentration, said second concentration being higher than said first concentration.

24. The method of claim 23, further comprising:

in situ doping the first epitaxial growth material to the first concentration; and in situ doping the second epitaxial growth material to the second concentration.

25. The method of claim 23, wherein said source and drain contact regions of the second epitaxial growth material exhibit a relatively lower resistivity than the first epitaxial growth material.

26. The method of claim 23, further comprising:

forming a transistor gate structure extending over a channel region between the transistor source and drain regions;

spacing the drain contact opening from a side of the transistor gate electrode by an offset distance sufficient to provide a relatively higher resistivity extension of the drain region between the channel region and the drain contact region.

27. The method of claim 26, wherein the relatively higher resistivity extension of the drain region forms a laterally diffused metal oxide semiconductor (LDMOS) configuration.

28. The method of claim 23, wherein epitaxially growing second epitaxial growth material comprises filling the first and second recesses with second epitaxial growth material.

29. The method of claim 23, further comprising depositing metal within the source and drain contact openings to form source and drain contacts, respectively, on the source and drain contact regions.

30. The method of claim 23, wherein forming the source contact opening comprises extending the source contact opening into the top of the raised source region, and wherein forming the drain contact opening comprises extending the drain contact opening into the top of the raised drain region.

* * * * *

UNITED STATES PATENT AND TRADEMARK OFFICE
CERTIFICATE OF CORRECTION

| | | |
|---|---|---|
| PATENT NO. | : 9,660,083 B2 | Page 1 of 1 |
| APPLICATION NO. | : 14/560255 | |
| DATED | : May 23, 2017 | |
| INVENTOR(S) | : Qing Liu et al. | |

It is certified that error appears in the above-identified patent and that said Letters Patent is hereby corrected as shown below:

In the Specification

At Column 3, Line number 16, please replace the term "(SOD)" with -- (SOI)) --.

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*